(12) United States Patent
Zhan et al.

(10) Patent No.: US 9,473,195 B2
(45) Date of Patent: Oct. 18, 2016

(54) PHASE-ARRAYED TRANSCEIVER

(71) Applicant: MEDIATEK INC., Hsin-chu (TW)

(72) Inventors: Jing-Hong Conan Zhan, Hsinchu (TW); Chuan-Kang Liang, San Jose, CA (US); Ti-Ku Yu, Yilan County (TW); Zhiming Deng, San Jose, CA (US)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/741,473

(22) Filed: Jun. 17, 2015

(65) Prior Publication Data

US 2015/0288411 A1    Oct. 8, 2015

Related U.S. Application Data (63) Continuation of application No. 13/301,811, filed on Nov. 22, 2011, now abandoned.

(60) Provisional application No. 61/487,346, filed on May 18, 2011, provisional application No. 61/487,347, filed on May 18, 2011.

(51) Int. Cl.
*H04B 1/38* (2015.01)
*H04B 1/40* (2015.01)
(Continued)

(52) U.S. Cl.
CPC .................. *H04B 1/40* (2013.01); *H01Q 3/30* (2013.01); *H01Q 21/0025* (2013.01); *H03F 3/19* (2013.01);
(Continued)

(58) Field of Classification Search
CPC ......... H04B 1/525; H04B 1/406; H04B 1/18

USPC .............. 375/219, 222, 296; 455/73, 78, 80, 455/276.1, 277.1, 562.1, 101
See application file for complete search history.

(56) References Cited

U.S. PATENT DOCUMENTS

| 4,635,062 A | 1/1987 | Bierig |
| 4,791,421 A | 12/1988 | Morse |

(Continued)

FOREIGN PATENT DOCUMENTS

| CN | 1343393 A | 4/2002 |
| CN | 1712986 A | 12/2005 |

(Continued)

OTHER PUBLICATIONS

Sohrab Emami, A 60GHz CMOS Phased-Array Transceiver Pair for Multi-Gb/s Wireless Communications , Feb. 22, 2011, 164-165, Figure 9.3.7, ISSCC 2011 / Session 9 / Wireless & mm-Wave Connectivity / 9.3, 2011 IEEE International Solid-State Circuits Conference.

(Continued)

*Primary Examiner* — Md Talukder
(74) *Attorney, Agent, or Firm* — Winston Hsu; Scott Margo (57) ABSTRACT

A phased-array transceiver includes: a plurality of antennas; a plurality of transceiving elements respectively coupled to the plurality of antennas; a signal processing block; and a first distributed network, coupled between the signal processing block and the transceiving elements, wherein the transceiving elements, the signal processing block, and the first distributed network are configured as a single chip, and a first transceiving path between one of the plurality of transceiving elements and the signal processing block and a second transceiving path between another of the plurality of transceiving elements and the signal processing block share at least partial signal traces of the first distributed network.

12 Claims, 7 Drawing Sheets

(51) Int. Cl.
*H01Q 3/30* (2006.01)
*H01Q 21/00* (2006.01)
*H03F 3/19* (2006.01)
*H03F 3/21* (2006.01)
*H04B 1/44* (2006.01)

(52) U.S. Cl.
CPC ........ *H03F 3/21* (2013.01); *H04B 1/44* (2013.01); *H03F 2200/294* (2013.01); *H03F 2200/451* (2013.01)

(56) References Cited

U.S. PATENT DOCUMENTS

| | | | |
|---|---|---|---|
| 5,173,703 | A | 12/1992 | Mangiapane |
| 5,276,452 | A | 1/1994 | Schuss |
| 5,412,414 | A | 5/1995 | Ast |
| 6,204,813 | B1 | 3/2001 | Wadell |
| 6,339,399 | B1 | 1/2002 | Andersson |
| 6,690,953 | B2 | 2/2004 | Rexberg |
| 7,486,223 | B2 | 2/2009 | Shima |
| 8,213,872 | B2 | 7/2012 | Lambrecht |
| 2002/0154687 | A1 | 10/2002 | Bierly |
| 2003/0156060 | A1 | 8/2003 | Revankar |
| 2004/0104845 | A1 | 6/2004 | McCarthy |
| 2004/0157646 | A1 | 8/2004 | Raleigh |
| 2004/0219892 | A1 | 11/2004 | Vaidyanathan |
| 2005/0113035 | A1 | 5/2005 | Kyongyop O |
| 2005/0147192 | A1 | 7/2005 | Yamamoto |
| 2005/0152346 | A1 | 7/2005 | Rabenko |
| 2006/0237830 | A1 | 10/2006 | Danno |
| 2007/0047560 | A1 | 3/2007 | Tsai |
| 2007/0104259 | A1 | 5/2007 | Herring |
| 2007/0135168 | A1* | 6/2007 | Liu ................. H01Q 3/40 455/562.1 |
| 2007/0173209 | A1* | 7/2007 | Kim ................ H04B 1/52 455/78 |
| 2008/0139132 | A1 | 6/2008 | Pan |
| 2008/0274710 | A1* | 11/2008 | Li .................. H04B 7/0837 455/272 |
| 2008/0274714 | A1 | 11/2008 | Yamaji |
| 2009/0115549 | A1 | 5/2009 | Lee |
| 2009/0273517 | A1 | 11/2009 | Thiesen |
| 2009/0290517 | A1 | 11/2009 | Rao |
| 2010/0093282 | A1 | 4/2010 | Martikkala |
| 2010/0099366 | A1* | 4/2010 | Sugar ............... H04B 1/005 455/75 |
| 2010/0164629 | A1 | 7/2010 | Behzad |
| 2010/0261440 | A1 | 10/2010 | Corman |
| 2011/0019723 | A1 | 1/2011 | Lerner |
| 2011/0254754 | A1 | 10/2011 | Qi |
| 2011/0274146 | A1 | 11/2011 | Huang |
| 2012/0142280 | A1 | 6/2012 | Banu |
| 2012/0293362 | A1 | 11/2012 | Liang |
| 2012/0294338 | A1* | 11/2012 | Zhan ................ H01Q 3/30 375/219 |
| 2013/0156085 | A1 | 6/2013 | Nicolson |
| 2015/0288411 | A1* | 10/2015 | Zhan ................ H01Q 3/30 375/219 |

FOREIGN PATENT DOCUMENTS

| | | |
|---|---|---|
| CN | 1751444 A | 3/2006 |
| CN | 101212441 A | 7/2008 |
| CN | 101582527 A | 11/2009 |
| EP | 0 509 843 A2 | 10/1992 |
| EP | 1 064 697 B1 | 12/2003 |
| WO | 2004025841 A2 | 3/2004 |

OTHER PUBLICATIONS

Maryam Tabesh, A 65nm CMOS 4-Element Sub-34mW/Element 60GHz Phased-Array Transceiver, Feb. 22, 2011, 166-167, Figure 9.4.7, ISSCC 2011 / Session 9 / Wireless & mm-Wave Connectivity / 9.4, IEEE International Solid-State Circuits Conference.

* cited by examiner

PHASE-ARRAYED TRANSCEIVER

CROSS REFERENCE TO RELATED APPLICATION

This application is a continuation of pending U.S. patent application Ser. No. 13/301,811, filed on Nov. 22, 2011, which claims the benefit of US Provisional Applications No. 61/487,346 and 61/487,347, filed on May 18, 2011, the entirety of which are incorporated by reference herein.

BACKGROUND

The present invention is related to a phase-arrayed transceiver, and more particularly to a low cost phase-arrayed transceiver.

Phase-arrayed transceivers are widely used in wireless communication systems. Phase-arrayed transceivers comprise a plurality of phase-arrayed channels, wherein a typical phase-arrayed channel comprises a transmitter and a receiver. Conventionally, the transmitter and the receiver of a phase-arrayed transceiver are completely separate from each other for ease of design and implementation, which means that the transmitter and the receiver in a phase-arrayed transceiver are coupled to different respective antennas and different phase shifters. The conventional architecture of the phase-arrayed transceivers therefore requires numerous phase shifters and large-area distribution networks, which consequently increases the manufacture cost. Accordingly, how to reduce the chip size of the phase-arrayed transceivers is an urgent problem in this field.

SUMMARY

One objective of the presented embodiment is to provide a phase-arrayed transceiver.

According to a first embodiment of the present invention, a phase-arrayed transceiver is provided. The phase-arrayed transceiver comprises a plurality of antennas, a plurality of transceiving elements, a signal processing block, and a first distributed network. The plurality of transceiving elements is respectively coupled to the plurality of antennas. The first distributed network is coupled between the signal processing block and the transceiving elements, wherein the transceiving elements, the signal processing block, and the first distributed network are configured as a single chip. A first transceiving path between one of the plurality of transceiving elements and the signal processing block and a second transceiving path between another of the plurality of transceiving elements and the signal processing block share at least partial signal traces of the first distributed network.

According to a second embodiment of the present invention, a transceiving element of a phased-array transceiver is provided. The transceiving element of the phased-array transceiver comprises a transmitting circuit and a receiving circuit. The transmitting circuit is disposed on a transmitting signal path. The receiving circuit is disposed on a receiving signal path, wherein the transmitting signal path and the receiving signal path share at least a partial signal trace; and the transmitting circuit and the receiving circuit are disposed in a single chip. Wherein the transceiving element further comprises a phase shifter; the transmitting circuit comprises a power amplifier, arranged to amplify an output of the phase shifter; and the receiving circuit comprises a low-noise amplifier, arranged to generate an output to the phase shifter; or the transmitting circuit comprises a first phase shifter and a power amplifier, which is arranged to amplify an output of the phase shifter; and the receiving circuit comprises a second phase shifter and a low-noise amplifier, which is arranged to generate an output to the phase shifter.

These and other objectives of the present invention will no doubt become obvious to those of ordinary skill in the art after reading the following detailed description of the preferred embodiment that is illustrated in the various figures and drawings.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
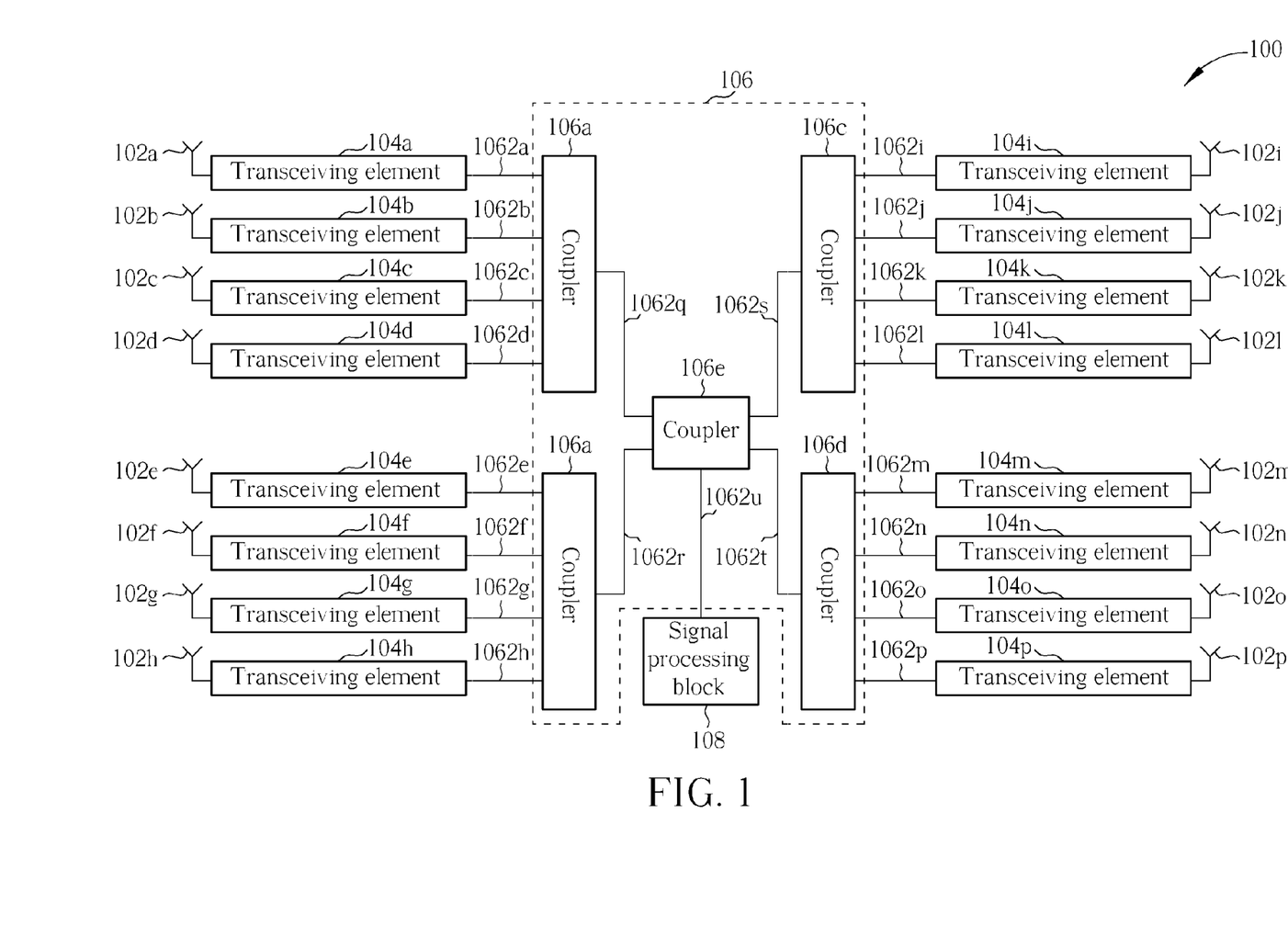
FIG. 1 is a diagram illustrating a phased-array transceiver according to a first embodiment of the present invention.

Please refer to FIG. 1, which is a diagram illustrating a phased-array transceiver 100 according to an embodiment of the present invention. In this embodiment, the phased-array transceiver 100 is a 16-channel phased-array transceiver, but this is not a limitation of the present invention. The phased-array transceiver 100 comprises a plurality of antennas 102a-102p, a plurality of transceiving elements 104a-104p, a first distributed network 106, and a signal processing block 108. The plurality of transceiving elements 104a-104p is respectively coupled to the plurality antennas 102a-102p. Each of the transceiving elements 104a-104p comprises a transmitting circuit and a receiving circuit, wherein the transmitting circuit (e.g. the transmitting circuit of the transceiving element 104a) is utilized to transmit a signal having a relative phase to one antenna (e.g. the antenna 102a), wherein the signal having the relative phase is generated by the signal processing block 108; and the receiving circuit (e.g. the receiving circuit of the transceiving element 104a) is utilized to receive a signal having a relative phase from the corresponding antenna (e.g. the antenna 102a).

The first distributed network 106 is coupled between the signal processing block 108 and the transceiving elements 104a-104p. In addition, the transceiving elements 104a-104p, the signal processing block 108, and the first distributed network 106 are configured as a single chip. According to the embodiment, a path from one antenna through the corresponding receiving circuit to the signal processing block 108 and a path from the signal processing block 108 through the corresponding transmitting circuit to the antenna share at least partial signal traces of the phased-array transceiver 100. For example, a first path from the antenna 102a through the receiving circuit of the transceiving element 104a to the signal processing block 108 and a second path from the signal processing block 108 through the transmitting circuit of the transceiving element 104a to the antenna 102a share at least partial signal traces (e.g. the signal trace labeled as 1062a in FIG. 1) of the phased-array transceiver 100.

In this embodiment, the first distributed network 106 comprises 21 conducting paths 1062a-1062u and five couplers 106a-106e, wherein the conducting paths 1062a-1062p are respectively coupled to the transceiving elements 104a-104p as shown in FIG. 1. The coupler 106a is utilized for transferring the signals between the conducting paths 1062a-1062p and the conducting path 1062g. More specifically, the first coupler 106a is utilized for combining the signals from the transceiving elements 104a-104d and outputting the combined signal to the conducting path 1062g, or transmitting the signal from the conducting path 1062g to the transceiving elements 104a-104d. Similarly, the coupler 106b is utilized for transferring the signals between the conducting paths 1062e-1062h and the conducting path 1062r. The coupler 106c is utilized for transferring the signals between the conducting paths 1062i-1062l and the conducting path 1062s. The coupler 106d is utilized for transferring the signals between the conducting paths 1062m-1062p and the conducting path 1062t. In addition, the coupler 106e is utilized for transferring the signals between the conducting paths 1062q-1062t and the conducting path 1062u.

According to the first distributed network 106, the conducting path 1062u is the shared signal trace between the couplers 106a-106d and the signal processing block 108. The conducting path 1062q is the shared signal trace between the conducting paths 1062a-1062d and the coupler 106d. The conducting path 1062r is the shared signal trace between the conducting paths 1062e-1062h and the coupler 106d. The conducting path 1062s is the shared signal trace between the conducting paths 1062i-1062l and the coupler 106d. The conducting path 1062t is the shared signal trace between the conducting paths 1062m-1062p and the coupler 106d. Moreover, the conducting path 1062a is the shared signal trace between the transmitting circuit and the receiving circuit of the transceiving element 104a and the coupler 106a. The conducting path 1062b is the shared signal trace between the transmitting circuit and the receiving circuit of the transceiving element 104b and the coupler 106a. By the same token, the conducting path 1062p is the shared signal trace between the transmitting circuit and the receiving circuit of the transceiving element 1044 and the coupler 104d.

By sharing the signal traces between the signal processing block 108 and the antennas 102a-102p, the area of the first distributed network 106 can be largely reduced in comparison with the conventional counterpart. It should be noted that the signal processing block 108 may be a baseband processing circuit or a mixer.

Figure 2:
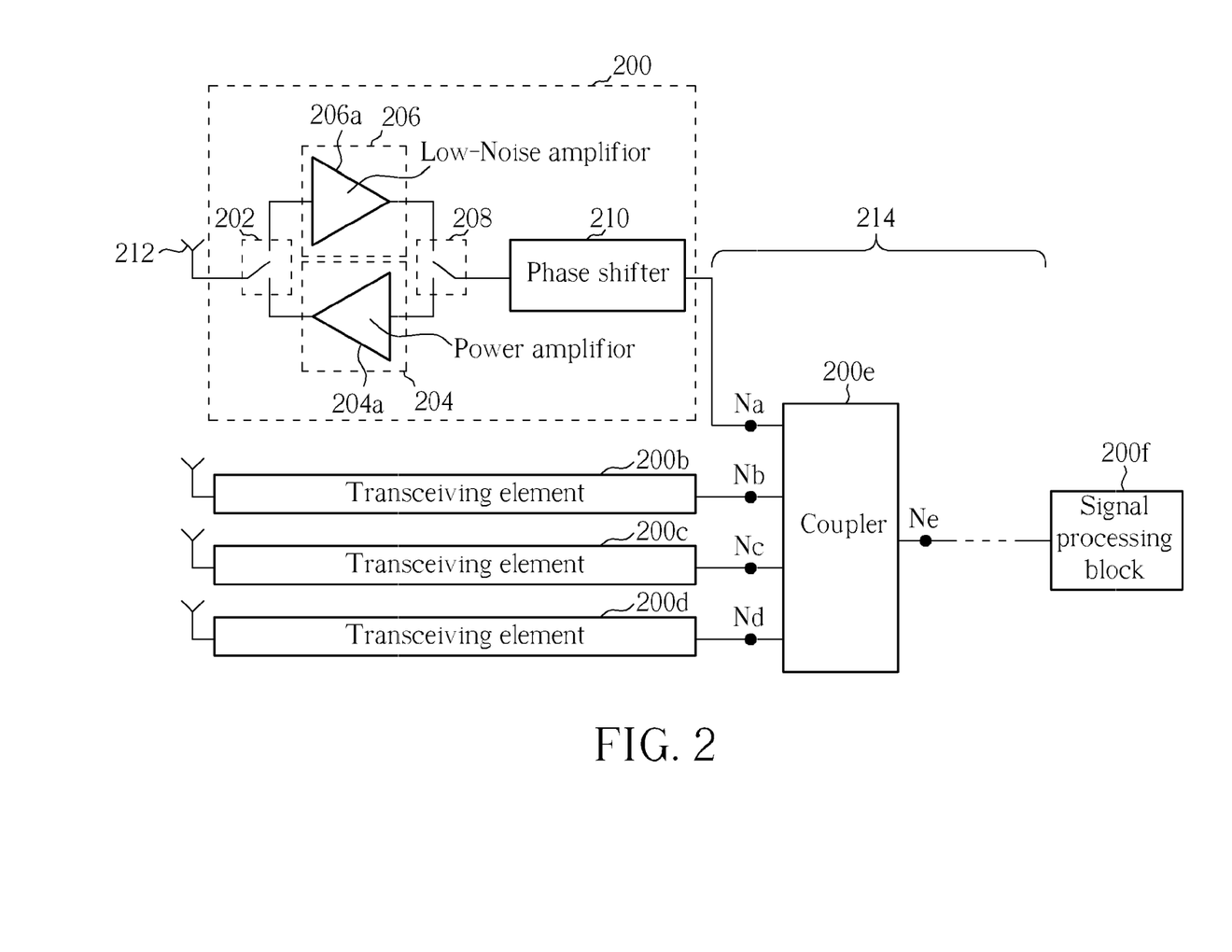
FIG. 2 is a diagram illustrating a transceiving element of the phased-array transceiver according to a second embodiment of the present invention.

Please refer to FIG. 2, which is a diagram illustrating a transceiving element 200 of a phased-array transceiver according to an embodiment of the present invention. The transceiving element 200 may be the embodiment of one transceiving element in the plurality of transceiving elements 104a-104p. The transceiving element 200 comprises a first switching device 202, a transmitting circuit 204, a receiving circuit 206, a second switching device 208, and a phase shifter 210. The first switching device 202 is arranged to selectively couple one of the transmitting circuit 204 and the receiving circuit 206 to the corresponding antenna. In this embodiment, the corresponding antenna is labeled as 212 for brevity. The transmitting circuit 204 comprises a power amplifier 204a, which is arranged to amplify an output of the phase shifter 210. The receiving circuit 206 comprises a low-noise amplifier 206a, which is arranged to generate an output to the phase shifter 210. Furthermore, the second switching device 208 is arranged to selectively couple one of the power amplifier 204a and the low-noise amplifier 206a to the phase shifter 210.

It should be noted that another three transceiving elements 200b-200d having a similar configuration to the transceiving element 200, a coupler 200e, and a signal processing block 200f, respectively, are also shown in FIG. 2 for illustrative purposes. The coupler 200e has five connection ports Na, Nb, Nc, Nd, and Ne, where the transceiving elements 200a-200d are coupled to the connection ports Na, Nb, Nc, Nd respectively, and the connection port Ne is coupled to the conducting path 214. The coupler 200e is arranged to receive signals from the connection port Ne and transmit signals to the connection ports Na, Nb, Nc, Nd, or receive signals from the connection ports Na, Nb, Nc, Nd and transmit signals to the connection port Ne. According to the transceiving element 200, the antenna 212 is the shared antenna of the transmitting circuit 204 and the receiving circuit 206, and the phase shifter 210 is the shared phase shifter of the transmitting circuit 204 and the receiving circuit 206. The conducting path 214 is the shared signal trace from the phase shifter 210 to the signal processing block 200f and from the signal processing block 200f to the phase shifter 210. Furthermore, the above-mentioned coupler may be a 4-to-1 combiner.

More specifically, when the phased-array transceiver operates in the signal transmitting mode, the first switching device 202 is controlled to connect the output terminal of the power amplifier 204a to the antenna 212 and disconnect the input terminal of the low-noise amplifier 206a from the antenna 212, and the second switching device 208 is controlled to connect the input terminal of the power amplifier 204a to the output terminal of the phase shifter 210 and disconnect the output terminal of the low-noise amplifier 206a from the input terminal of the phase shifter 210. It should be noted that, even though the input terminal and the output terminal of the phase shifter 210 are illustrated by the same terminal in FIG. 2, those skilled in the art should readily understand that this is only for illustrative purposes. Accordingly, the pre-transmitted signal generated by the signal processing block 200f can be transferred to the antenna 212 via the conducting path 214 (which includes the coupler 200e), the phase shifter 210, the second switching device 208, the power amplifier 204a, and the first switching device 202.

When the phased-array transceiver operates in the signal receiving mode, the first switching device 202 is controlled to connect the input terminal of the low-noise amplifier 206a to the antenna 212 and disconnect the output terminal of the power amplifier 204a from the antenna 212, and the second switching device 208 is controlled to connect the output terminal of the low-noise amplifier 206a to the input terminal of the phase shifter 210 and disconnect the input terminal of the power amplifier 204a from the output terminal of the phase shifter 210. Accordingly, the wireless signal received from the antenna 212 can be transferred to the signal processing block 200f, the first switching device 202, the low-noise amplifier 206a, the second switching device 208, the phase shifter 210, and the conducting path 214 (which includes the coupler 200e), in which the antenna 212, the phase shifter 210, and the conducting path 214 are shared elements.

Figure 3:
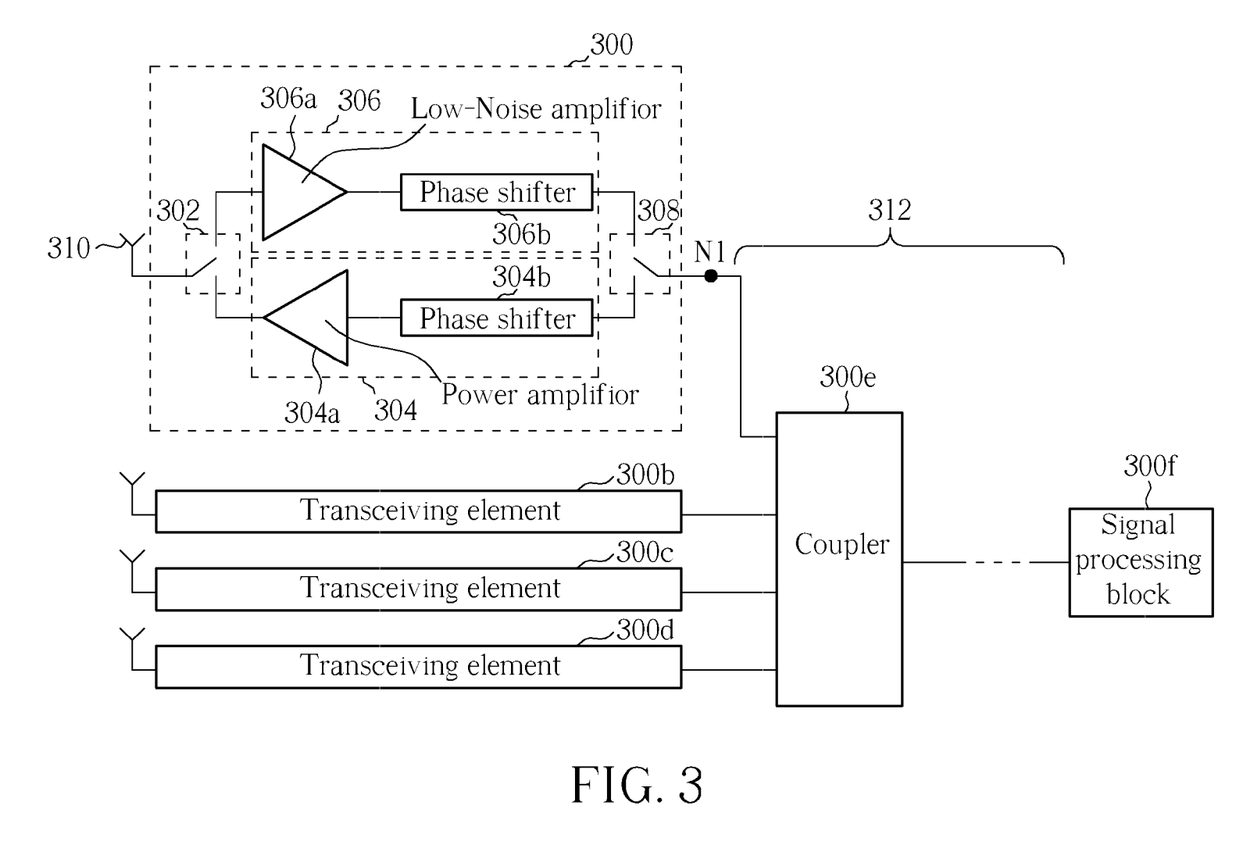
FIG. 3 is a diagram illustrating a transceiving element of the phased-array transceiver according to a third embodiment of the present invention.

Please refer to FIG. 3, which is a diagram illustrating a transceiving element 300 of a phased-array transceiver according to an embodiment of the present invention. The transceiving element 300 may be the embodiment of one transceiving element in the plurality of transceiving elements 104a-104p. The transceiving element 300 comprises a first switching device 302, a transmitting circuit 304, a receiving circuit 306, and a second switching device 308. The first switching device 302 is arranged to selectively couple one of the transmitting circuit 304 and the receiving circuit 306 to the corresponding antenna. In this embodiment, the corresponding antenna is labeled as 310 for brevity. The transmitting circuit 304 comprises a power amplifier 304a and a first phase shifter 304b. The power amplifier 304a is arranged to amplify an output of the first phase shifter 304b. The receiving circuit 306 comprises a low-noise amplifier 306a and a second phase shifter 306b. The low-noise amplifier 306a is arranged to generate an output to the second phase shifter 306b. Furthermore, the second switching device 308 is arranged to selectively couple one of the transmitting circuit 304 and the receiving circuit 306 to a connection port N1 of the distributed network.

It should be noted that another three transceiving elements 300b-300d having the similar configuration to the transceiving element 300, a coupler 300e, and a signal processing block 300f, respectively, are also shown in FIG. 3 for illustrative purposes. According to the transceiving element 300, the antenna 310 is the shared antenna of the transmitting circuit 304 and the receiving circuit 306. The conducting path 312 is the shared signal trace from the transmitting circuit 304 to the signal processing block 300f and from the signal processing block 300f to the receiving circuit 306.

More specifically, when the phased-array transceiver operates in the signal transmitting mode, the first switching device 302 is controlled to connect the output terminal of the power amplifier 304a to the antenna 310 and disconnect the input terminal of the low-noise amplifier 306a from the antenna 310, and the second switching device 308 is controlled to connect the input terminal of the first phase shifter 304b to the connection port N1 of the distributed network and disconnect the output terminal of the second phase shifter 306b from the connection port N1. Accordingly, the pre-transmitted signal generated by the signal processing block 300f can be transferred to the antenna 310 via the conducting path 312 (which includes the coupler 300e), the second switching device 308, the first phase shifter 304b, the power amplifier 304a, and the first switching device 302.

Moreover, when the phased-array transceiver operates in the signal receiving mode, the first switching device 302 is controlled to connect the input terminal of the low-noise amplifier 306a to the antenna 310 and disconnect the output terminal of the power amplifier 304a from the antenna 310, and the second switching device 308 is controlled to connect the output terminal of the second phase shifter 306b to the connection port N1 and disconnect the input terminal of the first phase shifter 304b from the connection port N1. Accordingly, the wireless signal received from the antenna 310 can be transferred to the signal processing block 300f, the first switching device 302, the low-noise amplifier 306a, the second phase shifter 306b, the second switching device 308, and the conducting path 312 (which includes the coupler 300e), in which the antenna 310 and the conducting path 312 are shared elements.

Figure 4:
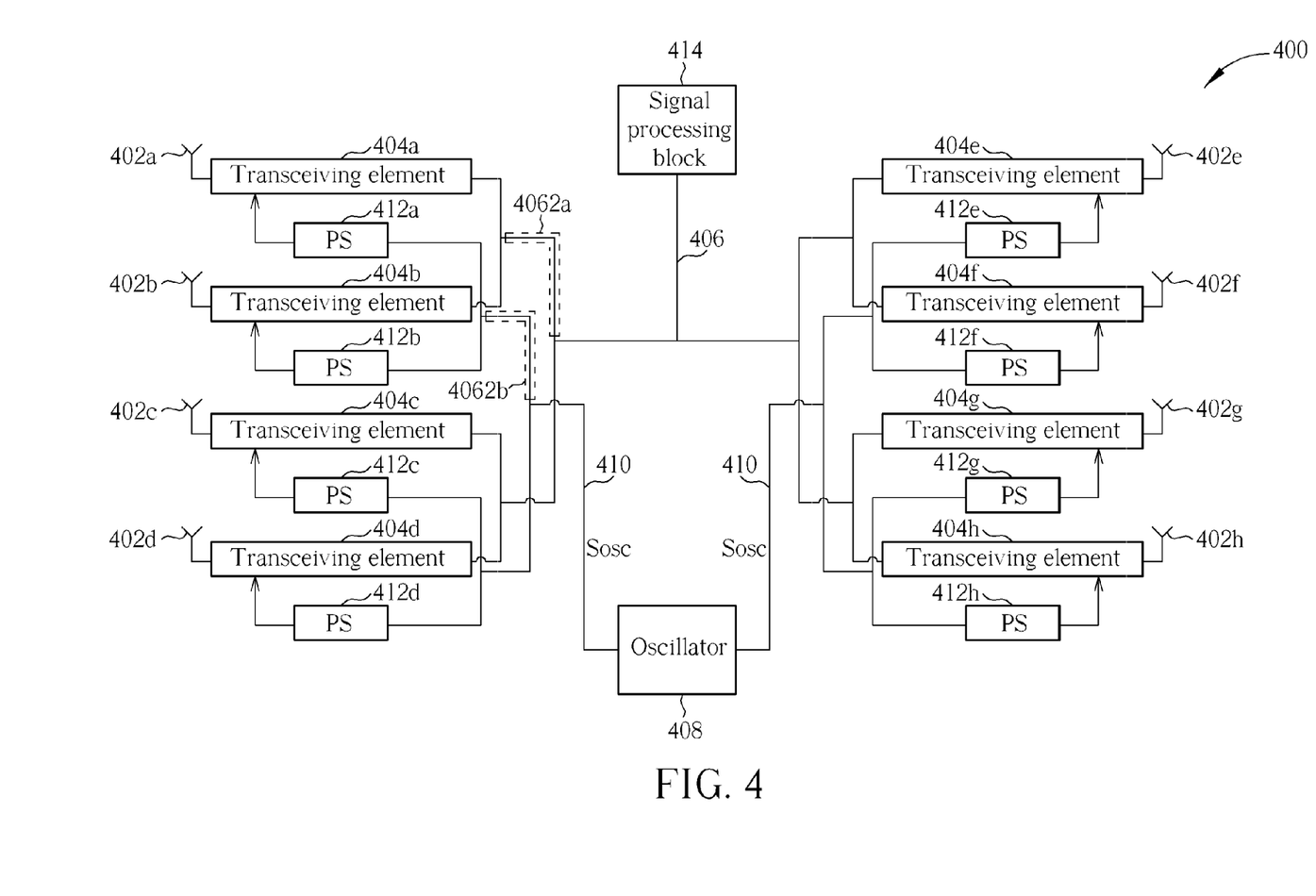
FIG. 4 is a diagram illustrating a phased-array transceiver according to a fourth embodiment of the present invention.

Please refer to FIG. 4, which is a diagram illustrating a phased-array transceiver 400 according to an embodiment of the present invention. In this embodiment, the phased-array transceiver 400 is an 8-channel phased-array transceiver, but this is not a limitation of the present invention. The phased-array transceiver 400 comprises a plurality of antennas 402a-402h, a plurality of transceiving elements 404a-404h, a first distributed network 406, an oscillator 408, a second distributed network 410, a plurality of phase shifters (PS) 412a-412h, and a signal processing block 414, wherein the first distributed network 406 comprises all the signal traces from the signal processing block 414 to the plurality of transceiving elements 404a-404h, and the second distributed network 410 comprises all the signal traces from the oscillator 408 to the plurality of phase shifters 412a-412h. The plurality of transceiving elements 404a-404h is respectively coupled to the antennas 402a-402h. Each of the transceiving elements 404a-404h comprises a transmitting circuit and a receiving circuit, wherein the transmitting circuit (e.g. the transmitting circuit of the transceiving element 404a) is utilized to transmit a signal having a relative phase to one antenna (e.g. the antenna 402a), wherein the signal having the relative phase is generated by the signal processing block 414; and the receiving circuit (e.g. the receiving circuit of the transceiving element 404a) is utilized to receive a signal having a relative phase from the corresponding antenna (e.g. the antenna 402a).

The first distributed network 406 is coupled between the signal processing block 414 and the transceiving elements 404a-404h. The oscillator 408 is arranged to generate a reference oscillating signal Sosc. The second distributed network 410 is arranged to transmit the reference oscillating signal Sosc. The plurality of phase shifters 412a-412h are arranged to receive the reference oscillating signal Sosc through the second distributed network 410 and respectively generate a plurality of phase-shifted reference oscillating signals according to the reference oscillating signal Sosc. In addition, the signal processing block 414 may be a digital baseband processing circuit, and the transceiving elements 404a-404h, the first distributed network 406, the oscillator 408, the second distributed network 410, the plurality of phase shifters 412a-412h, and the signal processing block 414 are configured as a single chip.

According to the embodiment, a path from one antenna through the corresponding receiving circuit to the signal processing block 414 and a path from the signal processing block 414 through the corresponding transmitting circuit to the antenna share at least partial signal traces of the phased-array transceiver 400. For example, a first path from the antenna 402a through the receiving circuit of the transceiving element 404a to the signal processing block 414 and a second path from the signal processing block 414 through the transmitting circuit of the transceiving element 404a to the antenna 402a share at least partial signal traces (i.e. the signal trace labeled as 4062a in FIG. 4) of the phased-array transceiver 400. Furthermore, a path from one phase shifter corresponding to one transceiving element through the second distributed network 410 to the oscillator 408 and a path from another phase shifter corresponding to another transceiving element through the second distributed network 410 to the oscillator 408 share at least partial signal traces of the phased-array transceiver 400. For example, a path from the phase shifter 412a corresponding to the transceiving element 404a through the second distributed network 410 to the oscillator 408 and a path from the phase shifter 412b corresponding to the transceiving element 402b through the second distributed network 410 to the oscillator 408 share at least partial signal traces (i.e. the signal trace labeled as 4062b in FIG. 4) of the phased-array transceiver 400. It should be noted that the plurality of phase shifters 412a-412h may provide different phases upon the reference oscillating signal Sosc to generate the plurality of phase-shifted reference oscillating signals.

Figure 5:
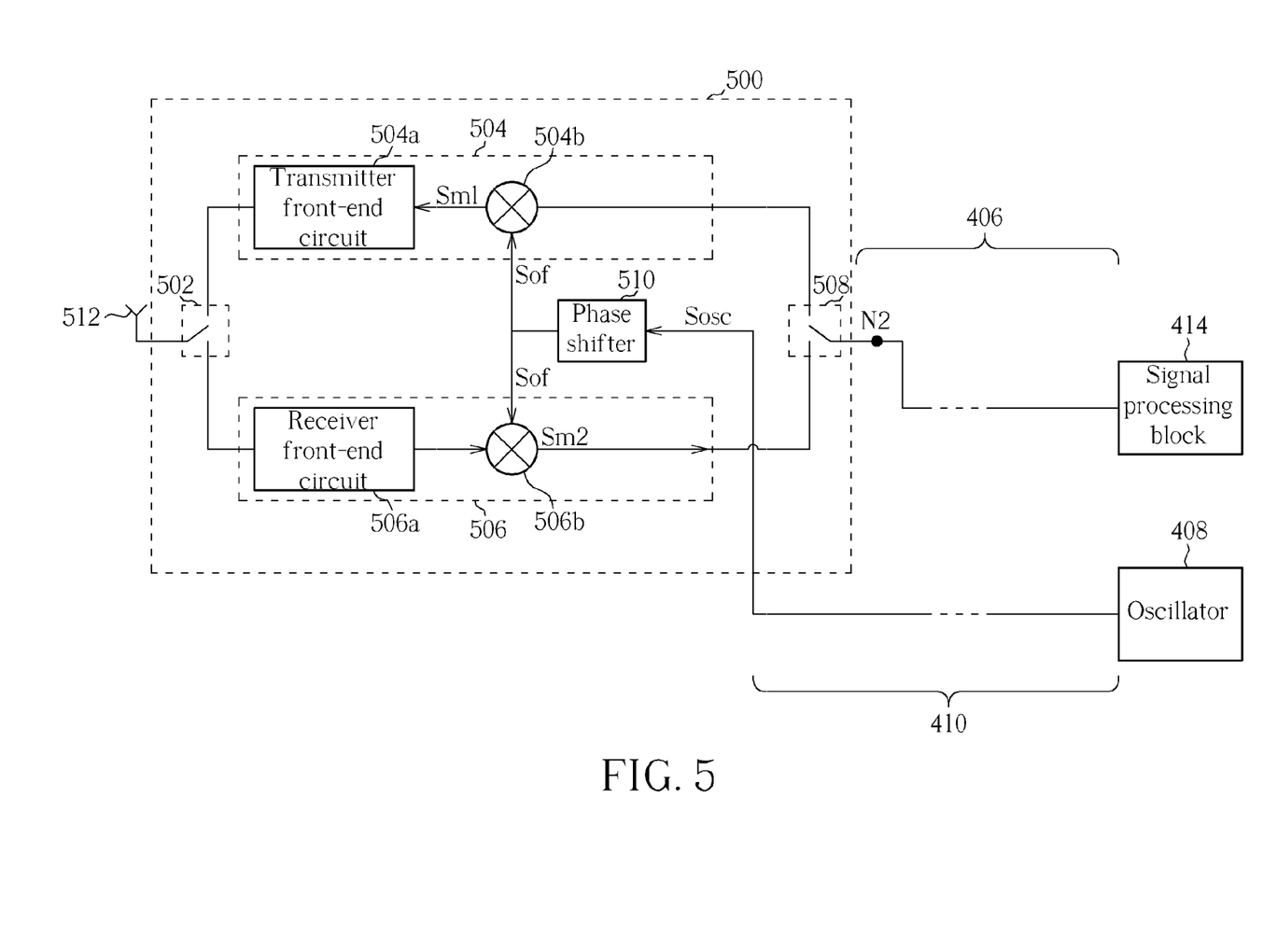
FIG. 5 is a diagram illustrating a transceiving element of the phased-array transceiver according to a fifth embodiment of the present invention.

Please refer to FIG. 5, which is a diagram illustrating a transceiving element 500 of a phased-array transceiver according to an embodiment of the present invention. The transceiving element 500 may be the embodiment of one transceiving element in the plurality of transceiving elements 404a-404h. The transceiving element 500 comprises a first switching device 502, a transmitting circuit 504, a receiving circuit 506, a second switching device 508, and a phase shifter 510. The first switching device 502 is arranged to selectively couple one of the transmitting circuit 504 and the receiving circuit 506 to the corresponding antenna. In this embodiment, the corresponding antenna is labeled as 512 for brevity. The transmitting circuit 504 comprises a transmitter front-end circuit 504a, and a mixer 504b. The mixer 504b is arranged to generate a mixer output Sm1 by up-converting an output of a connecting terminal of the second switching device 508. The transmitter front-end circuit 504a at least comprises a power amplifier (not shown) to amplify the mixer output Sm1 for generating the amplified mixer output to the first switching device 502.

The receiving circuit 506 comprises a receiver front-end circuit 506a, and a mixer 506b. The receiver front-end circuit 506a comprises at least a low-noise amplifier (not shown). The second mixer 506b is arranged to generate a mixer output Sm2 to a connecting terminal of the second switching device 508 by down-converting the output of the low-noise amplifier.

The phase shifter 510 receives the reference oscillating signal Sosc from the second distributed network 410, and generates the phase-shifted reference oscillating signal Sof the mixer 504b and the mixer 506b. The mixer 504b and the mixer 506b receive the phase-shifted reference oscillating signal Sof for generating the mixer output Sm1 and the mixer output Sm2 respectively. The first switching device 502 is arranged to selectively couple one of the transmitter front-end circuit 504a and the receiver front-end circuit 506a to the antenna 512.

More specifically, when the phased-array transceiver operates in the signal transmitting mode, the first switching device 502 is controlled to connect the output terminal of the transmitter front-end circuit 504a to the antenna 512 and disconnect the input terminal of the receiver front-end circuit 506a from the antenna 512, and the second switching device 508 is controlled to connect the input terminal of the mixer 504b to the connection port N2 of the distributed network 406 and disconnect the output terminal of the mixer 506b from the connection port N2.

Furthermore, when the phased-array transceiver operates in the signal receiving mode, the first switching device 502 is controlled to connect the input terminal of the receiver front-end circuit 506a to the antenna 512 and disconnect the output terminal of the transmitter front-end circuit 504a from the antenna 512, and the second switching device 508 is controlled to connect the output terminal of the mixer 506b to the connection port N2 and disconnect the input terminal of the mixer 504b from the connection port N2.

Figure 6:
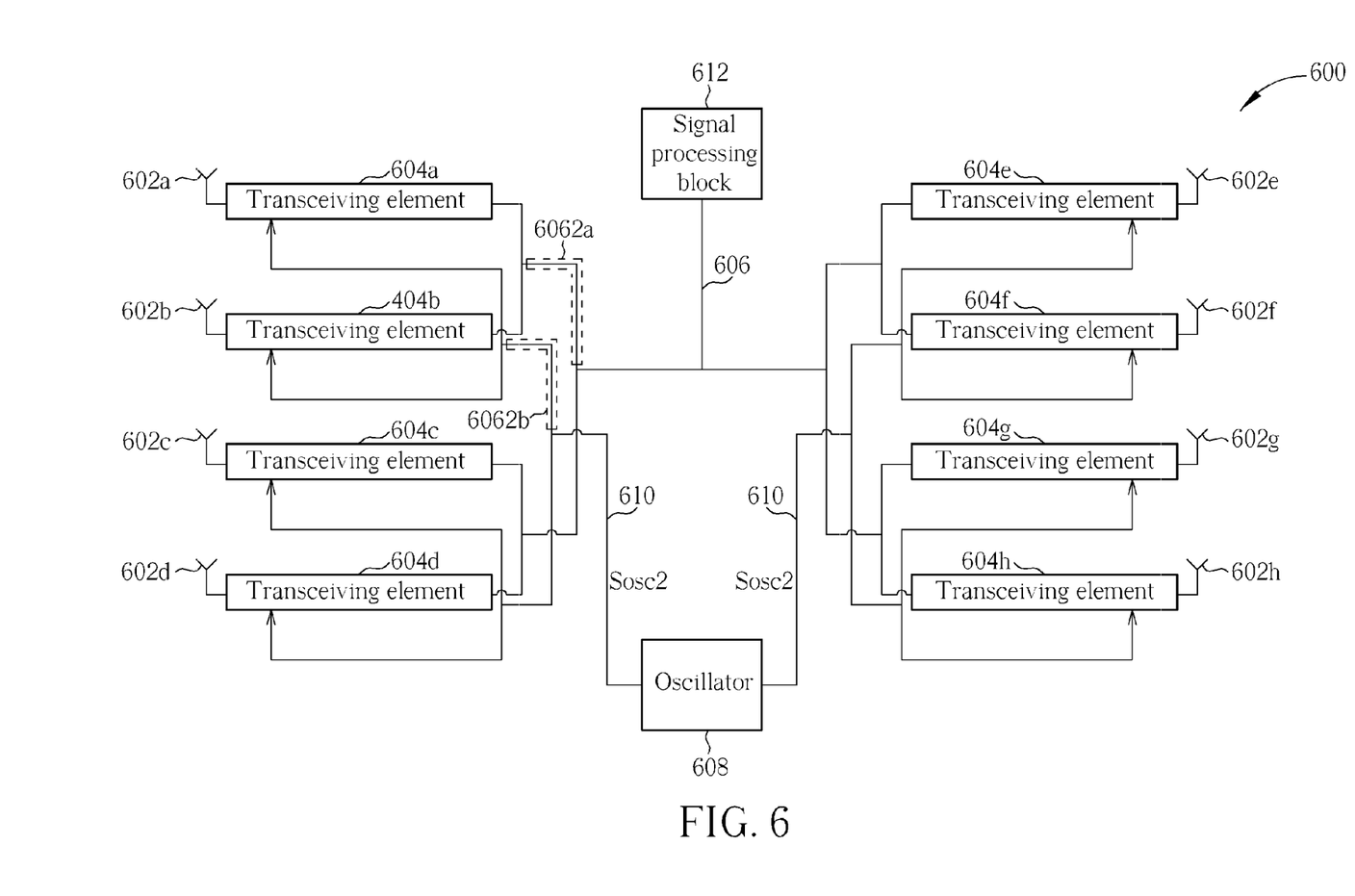
FIG. 6 is a diagram illustrating a phased-array transceiver according to a sixth embodiment of the present invention.

Please refer to FIG. 6, which is a diagram illustrating a phased-array transceiver 600 according to an embodiment of the present invention. In this embodiment, the phased-array transceiver 600 is an 8-channel phased-array transceiver, but this is not a limitation of the present invention. The phased-array transceiver 600 comprises a plurality of antennas 602a-602h, a plurality of transceiving elements 604a-604h, a first distributed network 606, an oscillator 608, a second distributed network 610, and a signal processing block 612, wherein the first distributed network 606 comprises all the signal traces from the signal processing block 612 to the plurality of transceiving elements 604a-604h, and the second distributed network 610 comprises all the signal traces from the oscillator 608 to the plurality of transceiving elements 604a-604h. The plurality of transceiving elements 604a-604h is respectively coupled to the antennas 602a-602h. Each of the transceiving elements 604a-604h comprises a transmitting circuit and a receiving circuit, wherein the transmitting circuit (e.g. the transmitting circuit of the transceiving element 604a) is utilized to transmit a signal having a relative phase to one antenna (e.g. the antenna 602a), wherein the signal having the relative phase is generated by the signal processing block 612; and the receiving circuit (e.g. the receiving circuit of the transceiving element 604a) is utilized to receive a signal having a relative phase from the corresponding antenna (e.g. the antenna 602a).

The first distributed network 606 is coupled between the signal processing block 614 and the transceiving elements 604a-604h. The oscillator 608 is arranged to generate a reference oscillating signal Sosc2. The second distributed network 610 is arranged to transmit the reference oscillating signal Sosc2 to the transceiving elements 604a-604h. In addition, the signal processing block 612 may be a digital baseband processing circuit, and the transceiving elements 604a-604h, the first distributed network 606, the oscillator 608, the second distributed network 610, and the signal processing block 612 are configured as a single chip.

According to the embodiment, a path from one antenna through the corresponding receiving circuit to the signal processing block 612 and a path from the signal processing block 612 through the corresponding transmitting circuit to the antenna share at least partial signal traces of the phased-array transceiver 600. For example, a first path from the antenna 602a through the receiving circuit of the transceiving element 604a to the signal processing block 612 and a second path from the signal processing block 612 through the transmitting circuit of the transceiving element 604a to the antenna 602a share at least partial signal traces (i.e. the signal trace labeled as 6062a in FIG. 6) of the phased-array transceiver 600. Furthermore, a path from one transceiving element through the second distributed network 610 to the oscillator 608 and a path from another transceiving element through the second distributed network 610 to the oscillator 608 share at least partial signal traces of the phased-array transceiver 600. For example, a path from the transceiving element 604a through the second distributed network 610 to the oscillator 608 and a path from the transceiving element 604b through the second distributed network 610 to the oscillator 608 share at least partial signal traces (i.e. the signal trace labeled as 6062b in FIG. 6) of the phased-array transceiver 600. It should be noted that, in this embodiment, the reference oscillating signal Sosc2 may be generated by different oscillators.

Figure 7:
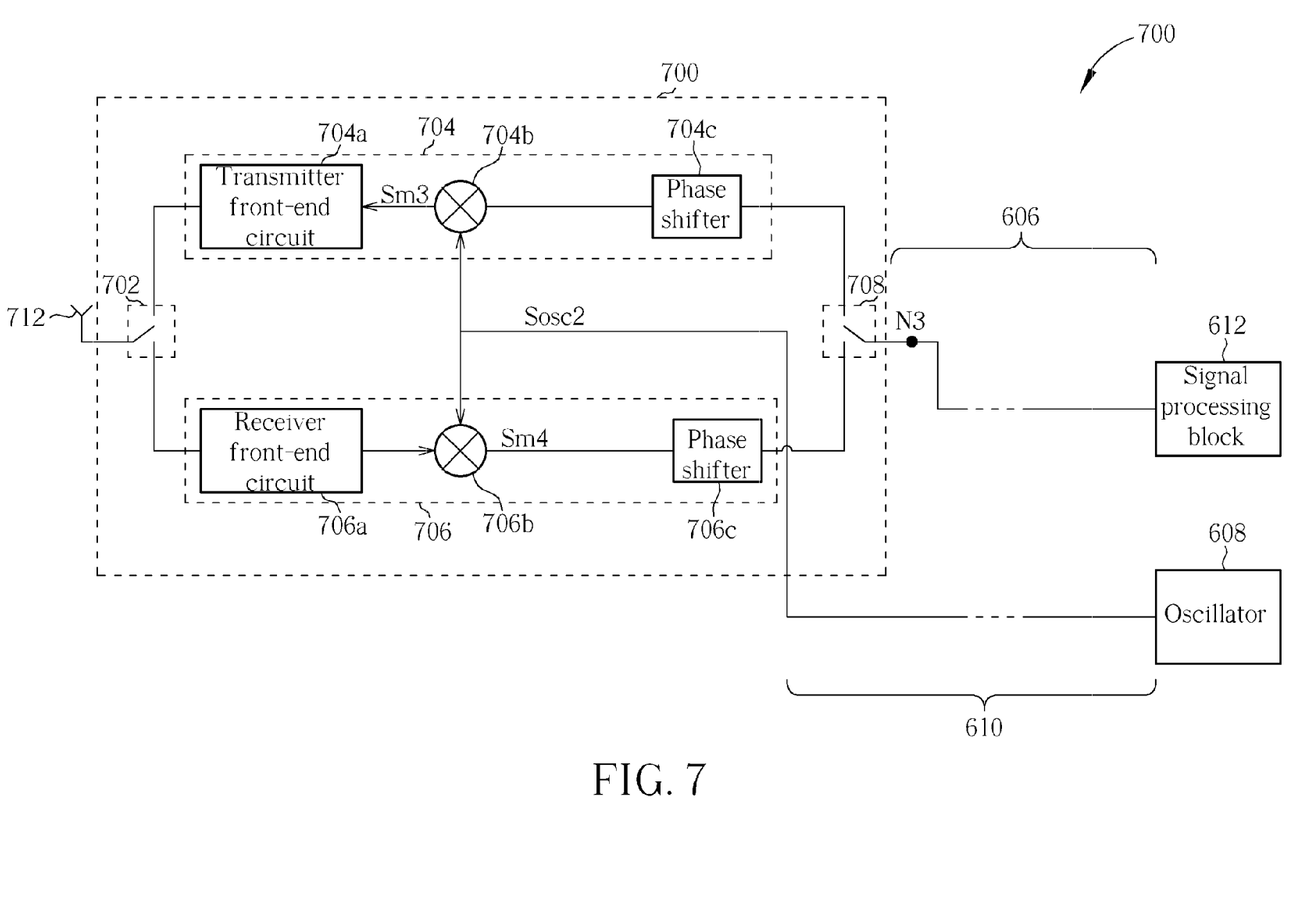
FIG. 7 is a diagram illustrating a transceiving element of the phased-array transceiver according to a seventh embodiment of the present invention.

Please refer to FIG. 7, which is a diagram illustrating a transceiving element 700 of a phased-array transceiver according to an embodiment of the present invention. The transceiving element 700 may be the embodiment of one transceiving element in the plurality of transceiving elements 604a-604h. The transceiving element 700 comprises a first switching device 702, a transmitting circuit 704, a receiving circuit 706, and a second switching device 708. The first switching device 702 is arranged to selectively couple one of the transmitting circuit 704 and the receiving circuit 706 to the corresponding antenna. In this embodiment, the corresponding antenna is labeled as 712 for brevity. The transmitting circuit 704 comprises a transmitter front-end circuit 704a, a mixer 704b, and a phase shifter 704c. The mixer 704b is arranged to generate a mixer output Sm3 by up-converting an output of the phase shifter 704c. The input terminal of the phase shifter 704c is connected to a connecting terminal of the second switching device 708. The transmitter front-end circuit 704a at least comprises a power amplifier (not shown) to amplify the mixer output Sm3 for generating the amplified mixer output to the first switching device 702.

The receiving circuit 706 comprises a receiver front-end circuit 706a, a mixer 706b, and a phase shifter 706c. The receiver front-end circuit 706a comprises at least a low-noise amplifier (not shown). The second mixer 706b is arranged to generate a mixer output Sm4 to the phase shifter 706c by down-converting the output of the low-noise amplifier. The output terminal of the phase shifter 706c is connected to a connecting terminal of the second switching device 708. Furthermore, the second switching device 708 is arranged to selectively couple one of the phase shifter 704c and the phase shifter 706c to the first distributed network 606.

In addition, the phase shifters 704c and 706c may be baseband phase shifters or intermediate-frequency phase shifters. The mixer 704b and the mixer 706b receive the reference oscillating signal Sosc2 for generating the mixer output Sm3 and the mixer output Sm4 respectively. The first switching device 702 is arranged to selectively couple one of the transmitter front-end circuit 704a and the receiver front-end circuit 706a to the antenna 712.

More specifically, when the phased-array transceiver operates in the signal transmitting mode, the first switching device 702 is controlled to connect the output terminal of the transmitter front-end circuit 704a to the antenna 712 and disconnect the input terminal of the receiver front-end circuit 706a from the antenna 712, and the second switching device 708 is controlled to connect the input terminal of the phase shifter 704c to the connection port N3 of the distributed network 606 and disconnect the output terminal of the phase shifter 706c from the connection port N3.

When the phased-array transceiver operates in the signal receiving mode, the first switching device 702 is controlled to connect the input terminal of the receiver front-end circuit 706a to the antenna 712 and disconnect the output terminal of the transmitter front-end circuit 704a from the antenna 712, and the second switching device 708 is controlled to connect the output terminal of the phase shifter 706c to the connection port N3 and disconnect the input terminal of the phase shifter 704c from the connection port N3.

The presented phase-arrayed transceivers are arranged to share the signal traces between the signal processing block and the plurality of antennas, and/or share the signal traces between the oscillator and the plurality of mixers; therefore, the area of the distributed networks can be largely reduced in comparison with the conventional counterpart. Accordingly, the costs of the presented phase-arrayed transceivers are greatly reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A phase-arrayed transceiver, comprising:
   a plurality of antennas;
   a plurality of transceiving elements, respectively coupled to the plurality of antennas, respectively;
   a signal processing block; and
   a first distributed network, coupled between the signal processing block and the transceiving elements, wherein the first distributed network comprises a first coupler connecting to the signal processing block, and for transferring signals between the signal processing block and at least two of the transceiving elements;
   wherein the plurality of transceiving elements, the signal processing block, and the first distributed network are configured as a single chip, and a first transceiving path between one of the plurality of transceiving elements and the signal processing block and a second transceiving path between another of the plurality of transceiving elements and the signal processing block share at least partial signal traces of the first distributed network, wherein each of the first transceiving path and the second transceiving path is a bidirectional communication path.

2. The phase-arrayed transceiver of claim 1, wherein each of the plurality of transceiving elements comprising a first transmitting circuit and a first receiving circuit, and a first receiving path from one of the plurality of antennas through corresponding first receiving circuit to the signal processing block and a second transmitting path from the signal processing block through corresponding first transmitting circuit to the one of the plurality of antennas share at least partial signal traces of the first distributed network.

3. The phase-arrayed transceiver of claim 2, wherein each of the plurality of transceiving element further comprises:
   a first switching device, arranged to selectively couple one of the first transmitting circuit and the first receiving circuit to the corresponding antenna.

4. The phase-arrayed transceiver of claim 2, wherein each of the plurality of transceiving element further comprises a phase shifter and a second switching device, and the first transmitting circuit comprises:
   a power amplifier, arranged to amplify an output of the phase shifter; and
   the first receiving circuit comprises:
   a low-noise amplifier, arranged to generate an output to the phase shifter;
   wherein the second switching device is arranged to selectively couple one of the power amplifier and the low-noise amplifier to the phase shifter.

5. The phase-arrayed transceiver of claim 2, wherein each of the plurality of transceiving element further comprises:
a third switching device, arranged to selectively couple one of the first transmitting circuit and the first receiving circuit to a connection port of the first distributed network.

6. The phase-arrayed transceiver of claim 5, wherein the first transmitting circuit comprises:
a first phase shifter; and
a power amplifier, arranged to amplify an output of the first phase shifter; and
the first receiving circuit comprises:
a second phase shifter; and
a low-noise amplifier, arranged to generate an output to the second phase shifter;
wherein the third switching device is arranged to selectively couple one of the first phase shifter and the second phase shifter to the connection port of the first distributed network.

7. The phased-array transceiver of claim 5, wherein the first transmitting circuit comprises:
a first mixer, arranged to generate a first mixer output by up-converting an output of the third switching device; and
a power amplifier, arranged to amplify the first mixer output;
the first receiving circuit comprises:
a low-noise amplifier; and
a second mixer, arranged to generate a second mixer output to the third switching device by down-converting an output of the low-noise amplifier; and
the phased-array transceiver further comprises:
an oscillator, arranged to generate a reference oscillating signal;
a second distributed network, arranged to transmit the reference oscillating signal; and
a phase shifter, arranged to receive the reference oscillating signal through the second distributed network and generate a phase-shifted reference oscillating signal according to the reference oscillating signal;
wherein both of the first mixer and the second mixer receive the phase-shifted reference oscillating signal to generate the first mixer output and the second mixer output, and the third switching device is arranged to selectively couple one of the first mixer and the second mixer to the connection port of the first distributed network.

8. The phase-arrayed transceiver of claim 5, wherein the first transmitting circuit comprises:
a first phase shifter;
a first mixer, arranged to generate a first mixer output by up-converting an output of the first phase shifter; and
a power amplifier, arranged to amplify the first mixer output; and
the first receiving circuit comprises:
a low-noise amplifier;
a second phase shifter; and
a second mixer, arranged to generate a second mixer output to the second phase shifter by down-converting an output of the low-noise amplifier;
wherein the third switching device is arranged to selectively couple one of the first phase shifter and the second phase shifter to the connection port of the first distributed network.

9. The phase-arrayed transceiver of claim 8, further comprising:
an oscillator, arranged to generate a reference oscillating signal; and
a second distributed network, arranged to transmit the reference oscillating signal;
wherein both the first mixer and the second mixer receive the reference oscillating signal through the second distributed network.

10. The phase-arrayed transceiver of claim 5, wherein each of the plurality of transceiving elements further includes a second transceiving element, the second transceiving element comprises a second transmitting circuit and a second receiving circuit, and a second receiving path from the antenna through the second receiving circuit to the signal processing block and a second transmitting path from the signal processing block through the second transmitting circuit to the antenna share at least partial signal traces of the phase-arrayed transceiver.

11. The phase-arrayed transceiver of claim 10, wherein the first distributed network comprises a coupler having a first connection port, a second connection port, and a third connection port; the third connection port is coupled to the first connection port and the second connection port, and arranged to receive signals from or transmit signals to the signal processing block; and the at least one transceiving circuit further comprises:
the third switching device, arranged to selectively couple the first transmitting circuit or the first receiving circuit to the first connection port; and
the second transceiving circuit further comprises:
a fourth switching device, arranged to selectively couple the second transmitting circuit or the second receiving circuit to the second connection port.

12. The phase-arrayed transceiver of claim 1, wherein the first distributed network further comprises a second coupler for transferring signals between the first coupler and at least two of the transceving elements.

* * * * *